US011615845B2

(12) United States Patent
Ishikawa et al.

(10) Patent No.: US 11,615,845 B2
(45) Date of Patent: *Mar. 28, 2023

(54) REDUNDANCY IN MICROELECTRONIC DEVICES, AND RELATED METHODS, DEVICES, AND SYSTEMS

(71) Applicant: Micron Technology, Inc., Boise, ID (US)

(72) Inventors: Toru Ishikawa, Kanagawa (JP); Minari Arai, Saitama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/249,284

(22) Filed: Feb. 25, 2021

(65) Prior Publication Data

US 2021/0202004 A1    Jul. 1, 2021

Related U.S. Application Data

(63) Continuation of application No. 16/727,194, filed on Dec. 26, 2019, now Pat. No. 10,984,868.

(51) Int. Cl.
*G11C 16/08* (2006.01)
*G11C 16/10* (2006.01)
(Continued)

(52) U.S. Cl.
CPC .............. *G11C 16/08* (2013.01); *G11C 16/10* (2013.01); *G11C 16/26* (2013.01); *G11C 29/24* (2013.01);
(Continued)

(58) Field of Classification Search
None
See application file for complete search history.

(56) References Cited

U.S. PATENT DOCUMENTS 5,577,050 A * 11/1996 Bair ..................... G11C 29/10
365/201
5,617,365 A    4/1997 Horiguchi et al.
(Continued)

FOREIGN PATENT DOCUMENTS

CN    103295647 A    2/2016
CN    105917409 B    5/2019

OTHER PUBLICATIONS

Chinese First Office Action for Application No. 202011319125.2, dated Nov. 18, 2021, 9 pages.

*Primary Examiner* — Ly D Pham
(74) *Attorney, Agent, or Firm* — TraskBritt

(57) ABSTRACT

Methods of operating a memory device are disclosed. A method may include enabling a first and second row section units a number of row section units of a memory device in response to a row address. The method may also include comparing a selected column address to a number of column addresses of defective memory cells of a first row section of the first row section unit. Moreover, in response to the selected column address matching a first column address of the number of column addresses, the method may include activating a second row section of the second row section unit, conveying a redundant column select signal to the memory array to select a redundant memory cell of the second row section. Memory devices and systems are also disclosed.

20 Claims, 11 Drawing Sheets

(51) Int. Cl.
*G11C 16/26* (2006.01)
*G11C 29/00* (2006.01)
*G11C 29/24* (2006.01)

(52) U.S. Cl.
CPC .......... *G11C 29/785* (2013.01); *G11C 29/808* (2013.01); *G11C 29/81* (2013.01); *G11C 29/835* (2013.01)

(56) References Cited

U.S. PATENT DOCUMENTS

| | | | |
|---|---|---|---|
| 6,381,174 B1* | 4/2002 | Roohparvar | G11C 29/82 365/185.09 |
| 7,933,162 B2 | 4/2011 | Nakanishi et al. | |
| 2004/0141384 A1* | 7/2004 | Keeth | G11C 29/848 365/200 |
| 2008/0266990 A1* | 10/2008 | Loeffler | G11C 29/808 365/201 |
| 2008/0291760 A1 | 11/2008 | Ito et al. | |
| 2011/0179322 A1* | 7/2011 | Lee | G11C 16/3454 714/719 |
| 2022/0068430 A1* | 3/2022 | Hulton | G06F 3/0659 |

* cited by examiner

REDUNDANCY IN MICROELECTRONIC DEVICES, AND RELATED METHODS, DEVICES, AND SYSTEMS

CROSS-REFERENCE TO RELATED APPLICATION

This application is a continuation of U.S. patent application Ser. No. 16/727,194, filed Dec. 26, 2019, now U.S. Pat. No. 10,984,868, issued Apr. 20, 2021, the disclosure of which is hereby incorporated herein in its entirety by this reference.

TECHNICAL FIELD

Embodiments of the disclosure relate generally to microelectronic devices. More specifically, various embodiments relate to redundancy in microelectronic devices, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Memory devices typically include many memory cells that are capable of holding a charge that is representative of a bit of data. Typically, these memory cells are arranged in a memory array. Data may be written to or retrieved from a memory cell by selectively activating the memory cell via an associated word line driver.

DETAILED DESCRIPTION

A semiconductor memory device typically includes an array of memory cells (also referred to herein as "memory elements"). Memory cells in the array are selected for reading and writing by means of row and column address signals input to the memory device. The row and column address signals are processed by address decoding circuitry to select row lines and column lines in the array to access the desired memory cell or memory cells.

When semiconductor devices are manufactured, defective memory cell may occur in the memory array or in a sub-array. To salvage the semiconductor memory device despite these defective memory cells, and thus to increase overall yield in the manufacturing process, redundancy is commonly implemented. Redundant memory cells are located in the memory array and the memory array may be associated with a number of redundant memory cells. When a defective memory cell is detected in the array, redundant decoding circuitry associated with the redundant memory cells may be programmed to respond to the address of the defective memory cell. When the address of the defective memory cell is selected for access, the redundant memory cell may be accessed (e.g., read from or written to) rather than the defective memory cell.

Various embodiments described herein relate to replacing at least one defective memory cell of a first row section of a memory array with at least one redundant memory cell of a second, different row section of the memory array. Further, in some embodiments, at least one defective memory cell of the first row section of a memory array may be replaced with at least one redundant memory cell of the first row section.

Although various embodiments are described herein with reference to memory devices, the present disclosure is not so limited, and the embodiments may be generally applicable to microelectronic devices that may or may not include semiconductor devices and/or memory devices.

Embodiments of the present disclosure will now explained with reference to the accompanying drawings.

Figure 1:
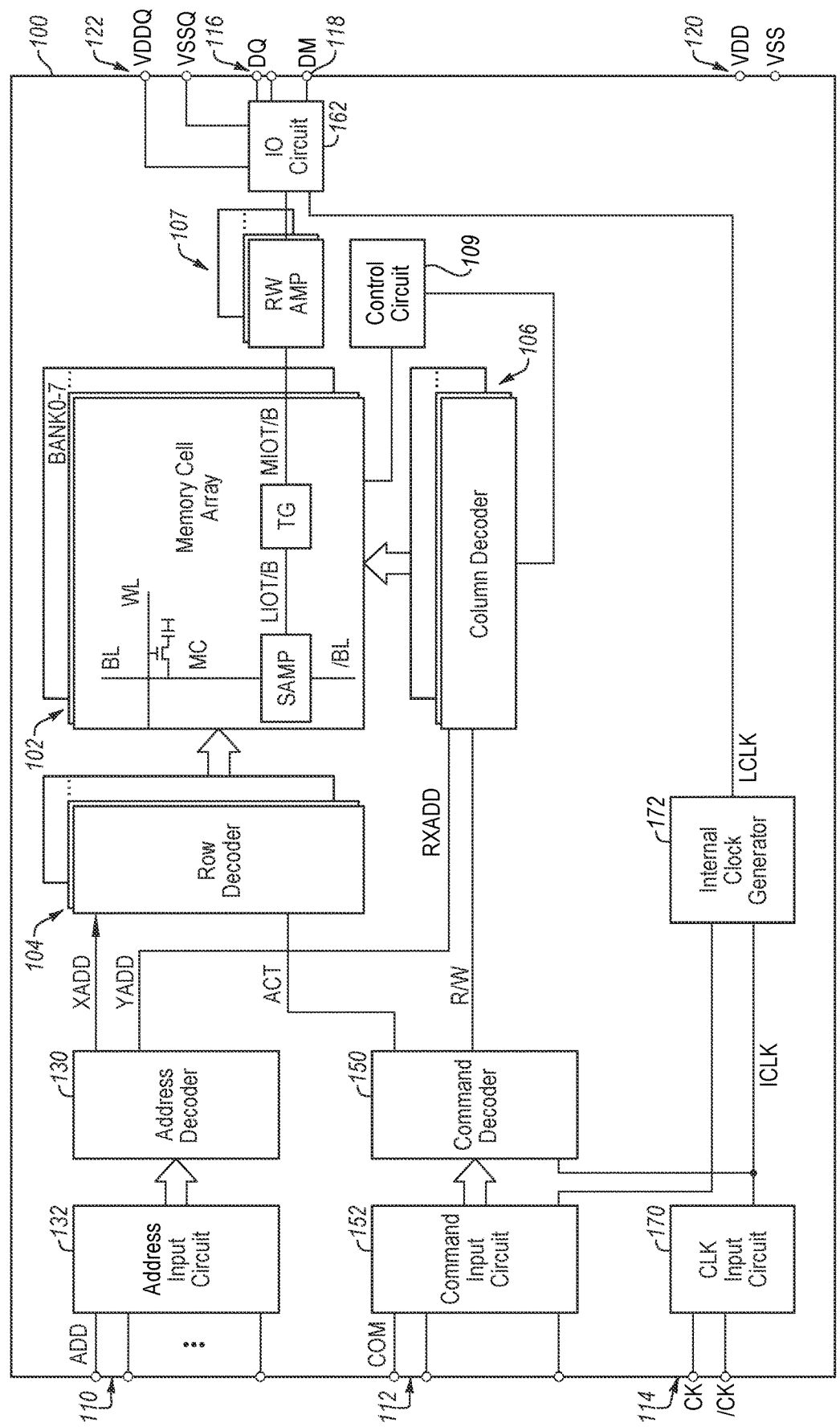
FIG. 1 is a block diagram of an example memory device, in accordance with at least one embodiment of the present disclosure.

FIG. 1 includes a block diagram of an example memory device 100, according to various embodiments of the present disclosure. Memory device 100, which is and may be referred to herein as a memory device, may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 107 over complementary local data lines (LIOT/B), transfer gate (TG), and complementary main data lines (MIOT/B). Conversely, write data outputted from read/write amplifiers 107 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal RAY may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 107, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 107, transfer gate TG, and sense amplifier SAMP. The write data may be written to memory cell MC specified by row address XADD and column address YADD.

As described more fully below, according to some embodiments, a control circuit 109 may receive one or more control signals (e.g., one or more signals responsive to a row address) and a column address. Further, control circuit 109 may compare the column address to one or more stored columns addresses of know defective memory cells and activate one or more row sections of memory array for accessing one or more memory cells of memory array.

Clock signals CK and/CK may be received via clock terminals 114. A clock input circuit 170 may generate internal clock signals ICLK based on clock signals CK and ICK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

As will be appreciated by a person having ordinary skill in the art, a "memory MAT" generally refers to a subunit of a memory bank having a plurality of memory cells. Each memory MAT is defined as a range in which a word line WL and a bit line BL extend.

Figure 2:
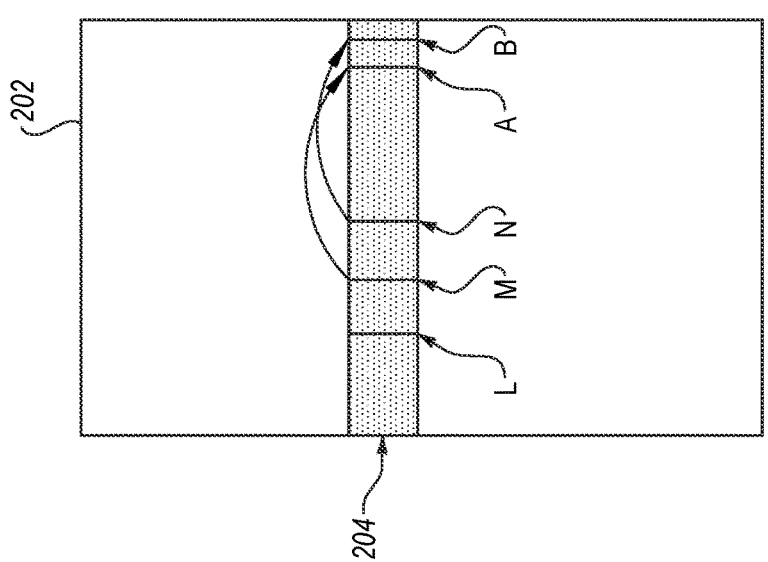
FIG. 2 depicts a portion of a memory array of a memory device.

FIG. 2 depicts a portion of a memory array 202 of a memory device. Memory array 202 includes a row section (e.g., a memory MAT) 204 including a number of memory cells at column addresses L, M, and N. Row section 204 further includes two redundant memory cells at redundant column addresses A and B. In this conventional device, if row section 204 is active and each of the memory cells at column addresses M and N is defective, redundant memory cells at redundant column addresses A and B may replace (i.e., be used in place of) the defective memory cells at column addresses M and N (e.g., a redundant memory cell at redundant column address A may replace a memory cell at column address M and a redundant memory cell at redundant column address B may replace a memory cell at column address N). As will be appreciated, row section 204 only includes two redundant memory cells, and conventional devices may only allow defective memory cells to be replaced by redundant memory cells within a common row section (e.g., within a common memory MAT). Thus, in this example, if a memory cell at column address L is also defective, the memory cell at column address L could not be replaced by a redundant memory cell (i.e., because row section 204 does not include another available redundant memory cell), and thus the memory device may fail.

Figure 3A:
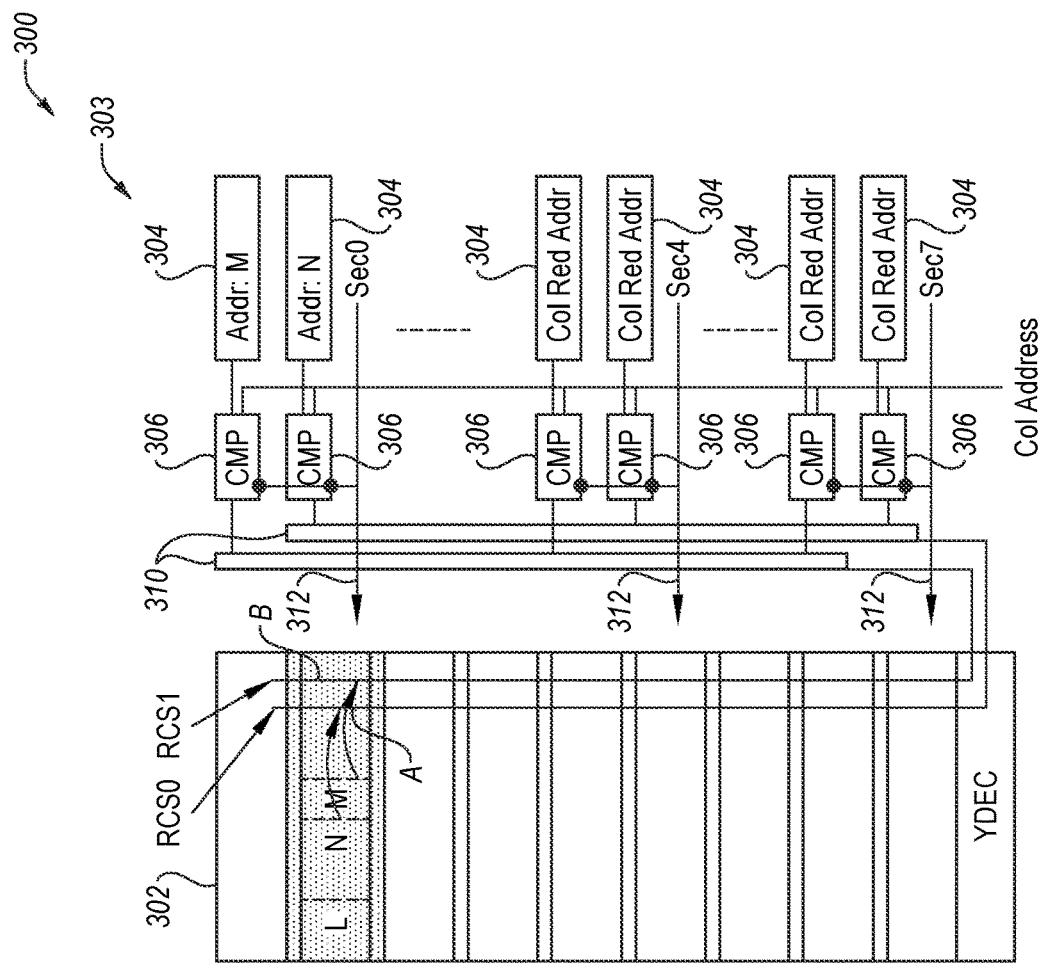
FIG. 3A depicts a portion of a memory array and associated control circuitry of a memory device.

FIG. 3A illustrates a memory device 300 including a portion of a memory array 302 and associated circuitry 303. Memory array 302 includes a number of row sections (e.g., row sections Section0-Section7) and redundant column select signal lines RCS0 and RCS1. Circuitry 303 includes address data 304, compare blocks 306, logic 310, and section control signal lines 312. It will be appreciated that although memory array 302 includes more than three row sections, for simplicity, FIG. 3A depicts circuitry for only three row sections (i.e., Section0, Section4, and Section7). Further, although memory array 302 is depicted as including only eight row sections (i.e., Section0-Section7), memory array 302 may include any suitable number of row sections.

In the example of FIG. 3A, memory cells at column addresses N and M of row section Section0 are known to be defective, and thus associated column addresses N and M are stored in address data 304 of circuitry associated with row section Section0. Like memory array 202 of FIG. 2, each row section of memory array 302 includes two redundant memory cells, and thus two defective memory cells at column addresses N and M of row section Section0 may be replaced by memory cells at redundant column addresses A and B.

During a contemplated operation of memory device 300, row section Section0, which is selected in response to one or more row addresses, may be activated via control signal Sec0. Compare block 306 associated with row section Section0 may also be activated via control signal Sec0. Compare block 306 (i.e., the compare block associated with row section Section0) may receive a selected column address "Col Address" and compare the selected column address to address data 304 (i.e., column address N and column address M), and in response to the selected column address matching either column address N or column address M (i.e., determined via compare block 306), a column select signal (i.e., column select signal RCS0 or column select signal RCS1) is asserted (i.e., via logic 310), and instead of accessing the defective memory cell at either column address N or column address M, a redundant memory cell of row section Section0 is accessed via either redundant column address A or redundant column address B.

Figure 3B:
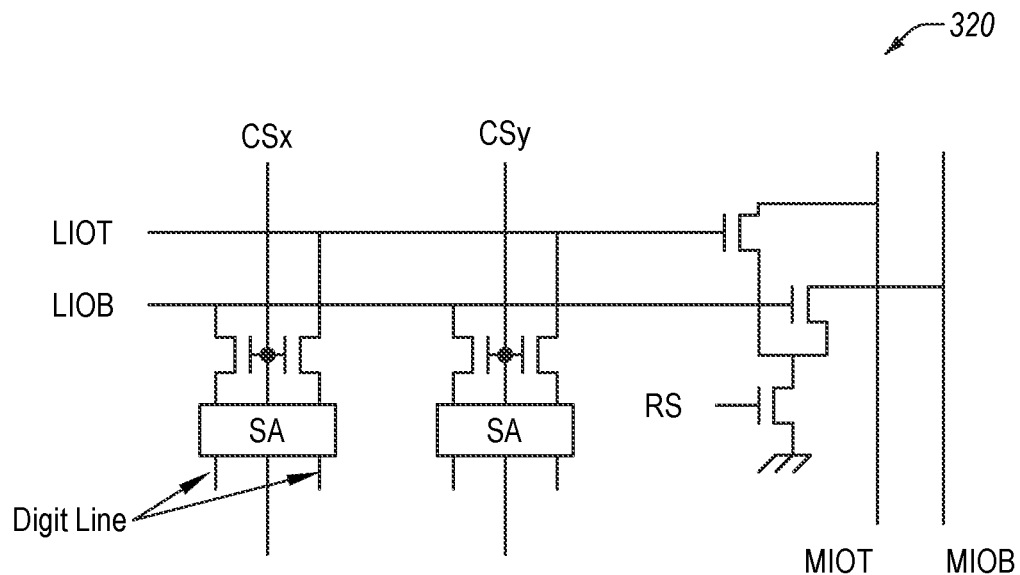
FIG. 3B illustrates circuitry including sense amplifiers of the memory device of FIG. 3A.
Figure 3C:
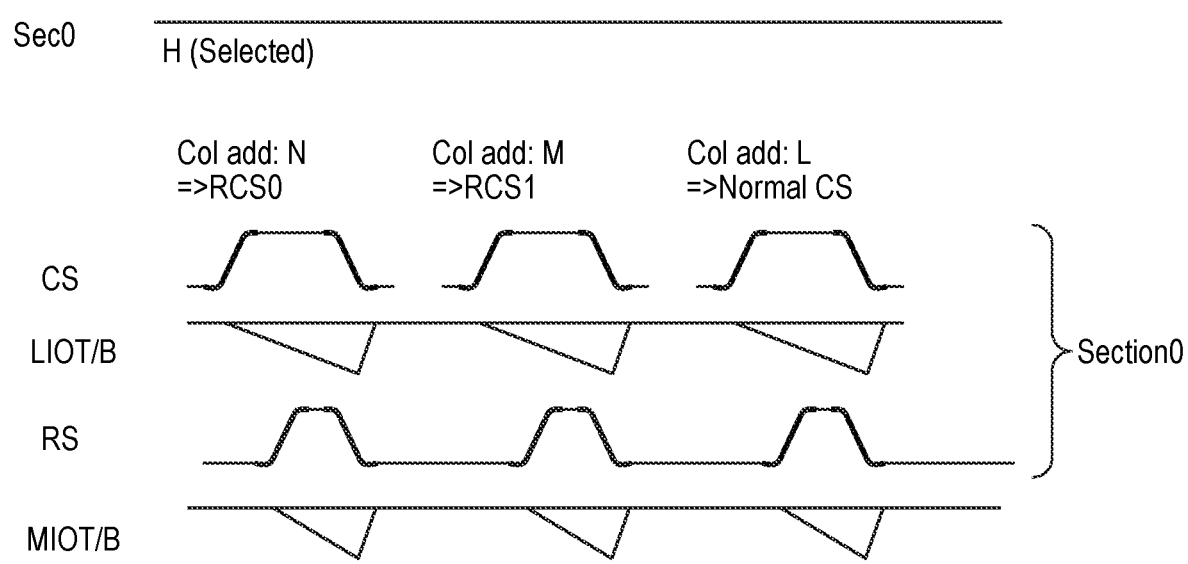
FIG. 3C is a timing diagram including various signals associated with the memory device of FIG. 3A.

More specifically, with reference to FIGS. 3A-3C, a contemplated read operation of memory device 300 will now be described. Initially, control signal Sec0 is asserted (i.e., control signal Sec0 is high (H)) in response to one or more row addresses, as shown in plot 330 of FIG. 3C. If the selected column address "Col Address" matches column address N, a column select (CS) signal is asserted (i.e., column select signal RCS0 is asserted) via logic 310, and a memory cell at column address N is replaced by a redundant memory cell at redundant column address A (i.e., a memory cell at column address A is accessed (i.e., for a read operation) rather than the memory cell at column address N). If the selected column address "Col Address" matches column address M, column select (CS) signal is asserted (i.e., column select signal RCS1 is asserted) via logic 310, and a memory cell at column address M is replaced by a redundant memory cell at redundant column address B. If the selected column address "Col Address" does not match either column address M or column address N (e.g., the selected column address is column address L), column select CS is asserted (i.e., via a conventional process). If the memory cell at column address L is defective, memory device 300 may fail.

In response to a column select CS signal (i.e., regardless of the selected column address is column address M, column address N, or an address associated with a non-defective memory cell), data is provided to local data lines LIOT/LIOB of circuitry 320 via sense amplifier SA. Further, in response to row select RS being asserted, the data is provided to main data lines MIOT/MIOB.

Figures 4, 5A:
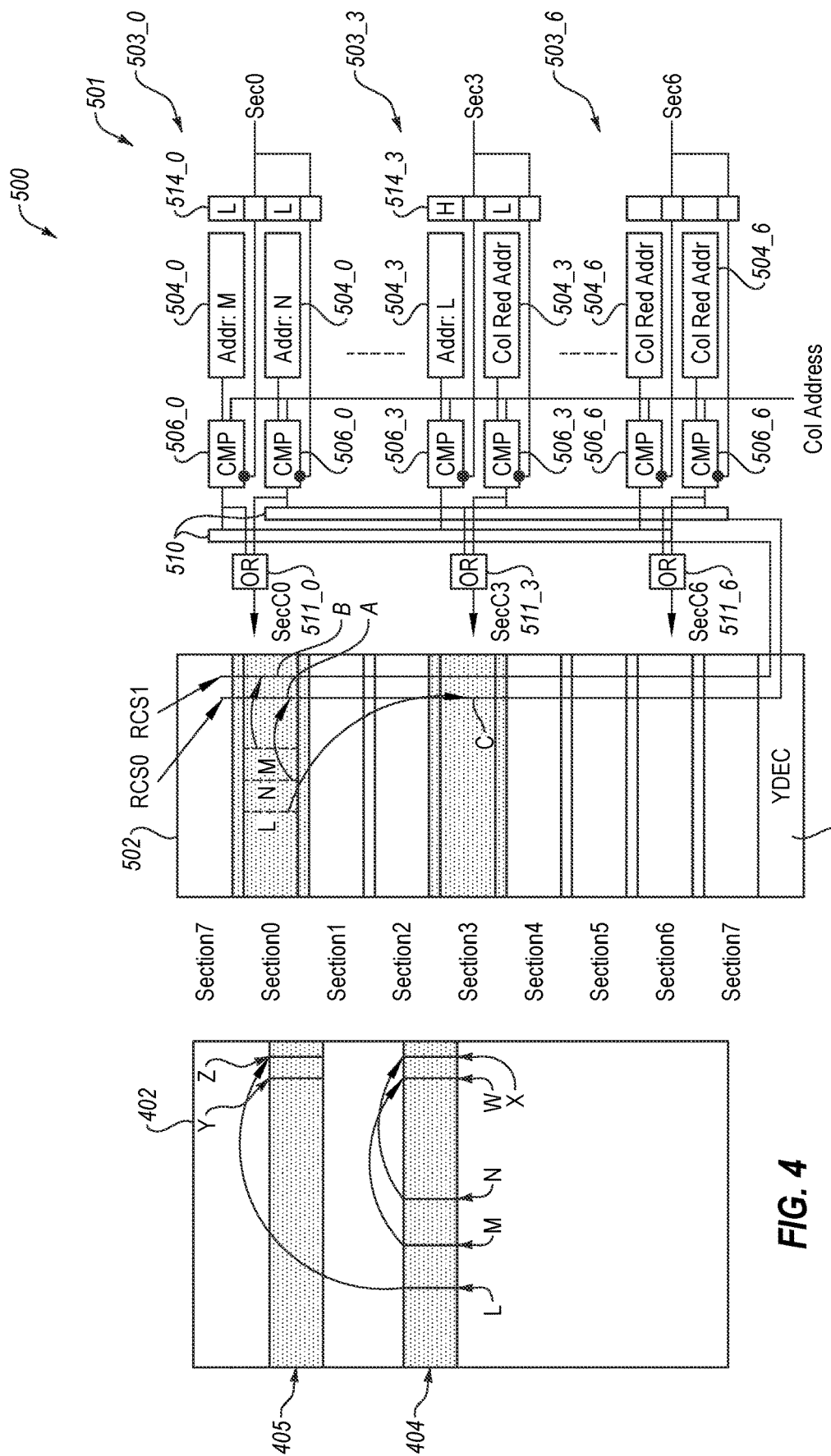
FIG. 4 depicts a portion of an example memory array of a memory device, in accordance with various embodiments of the present disclosure.
FIG. 5A depicts a portion of a memory array and associated control circuitry of an example memory device, according to various embodiments of the present disclosure.

FIG. 4 depicts a portion of an example memory array 402 of a memory device, in accordance with various embodiments of the present disclosure. Memory array 402 includes a row section (e.g., a memory MAT) 404 including a memory cell at each of columns addresses L, M, and N. Row section 404 further includes two redundant memory cells at redundant columns addresses W and X. Memory array 402 further includes a row section (e.g., a memory MAT) 405 including two redundant memory cells at two redundant columns addresses Y and Z.

In the embodiment shown in FIG. 4, if row section 404 is active, and memory cells at each of column addresses M and N of row section 404 are defective, redundant columns addresses W and X of row section 404 may be accessed (e.g., for a read or a write operation) instead of column addresses M and N (e.g., a redundant memory cell at redundant column address W may be accessed instead of a memory cell at column addresses M, and a redundant memory cell at redundant column address X may be accessed instead of a memory cell at column addresses N). Further, if a memory cell at column address L of row section 404 is also defective, row section 405 may be activated and either a redundant memory cell at redundant columns address Y of row section 405 or a redundant memory cell at redundant columns address Z of row section 405 may replace a memory cell at column address L of row section 404.

FIG. 5A illustrates portion of an example memory device 500, according to various embodiments of the present disclosure. More specifically, FIG. 5A illustrates control circuitry 501 and a portion of a memory array 502 of memory device 500. For example only, control circuit 109 of FIG. 1 may include control circuitry 501. Memory array 502 includes a number of row sections (e.g., row sections Section0-Section7) and redundant column select signals RCS0 and RCS1. For example, each row section of memory array 502 may include a memory MAT. Further, each row section of memory array 502 includes a number (e.g., two) of redundant memory cells, wherein each redundant memory cell of the row section is accessible via a redundant columns address. Memory device 500 further includes column decoder ("YDEC") 515 configured to drive column select (CS) signals.

Control circuitry 501 includes address data 504 (i.e., including stored known column addresses of defective memory cells), compare blocks 506, logic 510, and OR gates 511. Control circuitry 501 further includes programmable elements 514, such as a programmable fuse element (e.g., an N-bit fuse). Control circuitry 501 is configured to receive one or more control signals (i.e., control signals Sec0-Sec7) (e.g., selected responsive to row addresses).

As will be appreciated, each row section of memory array 502 is associated with a portion of control circuitry 501 (e.g., an associated control circuit including address data 504, compare block 506, logic 510, OR gates 511, and programmable element 514). For example, memory device 500 includes a number of row section units 503, wherein each row section unit 503 includes a row section and a control circuit (e.g., including address data 504, compare block 506, logic 510, OR gates 511, and programmable element 514). More specifically, for example, row section unit 503_0 includes row section Section0 and a control circuit that includes address data 504_0, compare block 506_0, logic 510, OR gates 511_0, and programmable element 514_0. Each compare block 506 of memory device 500 may include one or more compare circuits (i.e., for comparing two addresses). More specifically, for example, as depicted, compare block 506_0 includes two compare circuits (i.e., one for comparing address M to "Col Address" and one for comparing address N to "Col Address"). Further, address data 504 may store one or more column addresses, and programmable element 514 may include one or more programmable bits.

It will be appreciated that although memory array 502 includes more than three row sections, for simplicity FIG. 5A depicts circuitry for only three row sections (i.e., Section0, Section3, and Section6). Further, although memory array 502 is depicted as only including eight row sections (Section0-Section7), memory array 502 may include any suitable number of row sections.

According to some embodiments, if it is determined (e.g., via testing) that a row section of a memory array (e.g., memory array 502) includes more than a threshold number (e.g., two) defective memory cells, the row section (or a row section unit) may be "paired" (e.g., linked) with at least one other row section (or row section unit) of the memory array. In other words, in the example embodiment of FIG. 5A, memory array 502 may be programmed (e.g., via a programmable fuse) such that one row section of memory array 502, which includes more than two defective memory cells, is paired with at least one other row section of memory array 502. As described more fully below, in one example, row section Section0 (e.g., a "primary row section"), which in this example includes three defective memory cells, is paired with row section Section3 (e.g., a "secondary row section"). Thus, in this example, row section unit 503_0 (e.g., a "primary row section unit") may be paired with row section unit 503_3 (e.g., a "secondary row section unit").

Further, according to some embodiments, a bit in programmable element 514_X in a first state (e.g., a LOW bit) may indicate that the associated redundant column address is used for the same row section, and the bit in programmable element 514_X in a second, different state (e.g., a HIGH bit) may indicate that the associated redundant column address is used for another row section. In other words, for example, assuming row section Section0 and row section Section3 are linked, if programmable element 514_3 is low ("L"), the redundant column address stored in programmable element 514_3 is to be used for row section Section3. On the other hand, if programmable element 514_3 is high ("H"), the redundant column address stored in address data 504_3 is to be used for row section Section0. In the example shown in FIG. 5A, programmable element 514_3 of row section unit 503_3 includes a high "H" bit, and address data 504_3 of row section unit 503_3 includes column address L, which is a column address of row section Section0.

According to some embodiments, a secondary row section unit (e.g., row section unit 503_3) of a row section unit pair is only activated if its row section pair (i.e., the primary row section) is activated and at least one programmable bit of its programmable element 514 is enabled (e.g., is HIGH). In other embodiments, a secondary row section unit (e.g., row section unit 503_3) of a row section unit pair may be activated in response to a primary row section (e.g., row section unit 503_0) being activated.

During a contemplated operation of memory device 500, row section unit 503_0 receives control signal Sec0, which is asserted responsive to one or more row addresses. Each compare circuit of compare block 506_0 may be enabled via control signal Sec0, and compare block 506_0 may receive a selected column address "Col Address" and compare the selected column address to address data 504_0 (i.e., column address N and column address M). In response to the selected column address matching either column address N or column address M (i.e., determined via compare block 506_0), compare block 506_0 may generate a signal, which may assert a column select signal (i.e., column select signal RCS0 or column select signal RCS1) via logic 510. Further, OR gate 511_0, which may receive the signal from compare block 506_0, may generate an asserted control signal SecC0 to activate row section Section0. Depending on the selected column address, column select signal RCS0 may be selected to replace a memory cell at column address N with a redundant memory cell at redundant column address A, or column select signal RCS1 may be selected to replace a memory cell at column address M with a redundant memory cell at redundant column address B.

Moreover, in this example, control signal Sec3 is also asserted (i.e., based on the programmed pairing of row section Section0 and row section Section3, and the high "H" bit of programmable element 514_3). Further, at least one compare circuit of compare block 506_3 is enabled (i.e., via control signal Sec3), and compare block 506_3 may compare the selected column address "Col Address" to stored address data (i.e., column address L). In response to the selected column address matching column address L, row section Section3 may be activated (i.e., via control signal SecC3), column select signal RCS0 is asserted (i.e., via logic 510), and a memory cell at column address L is replaced by a redundant memory cell at redundant column address C of row section Section3.

Figure 5B:
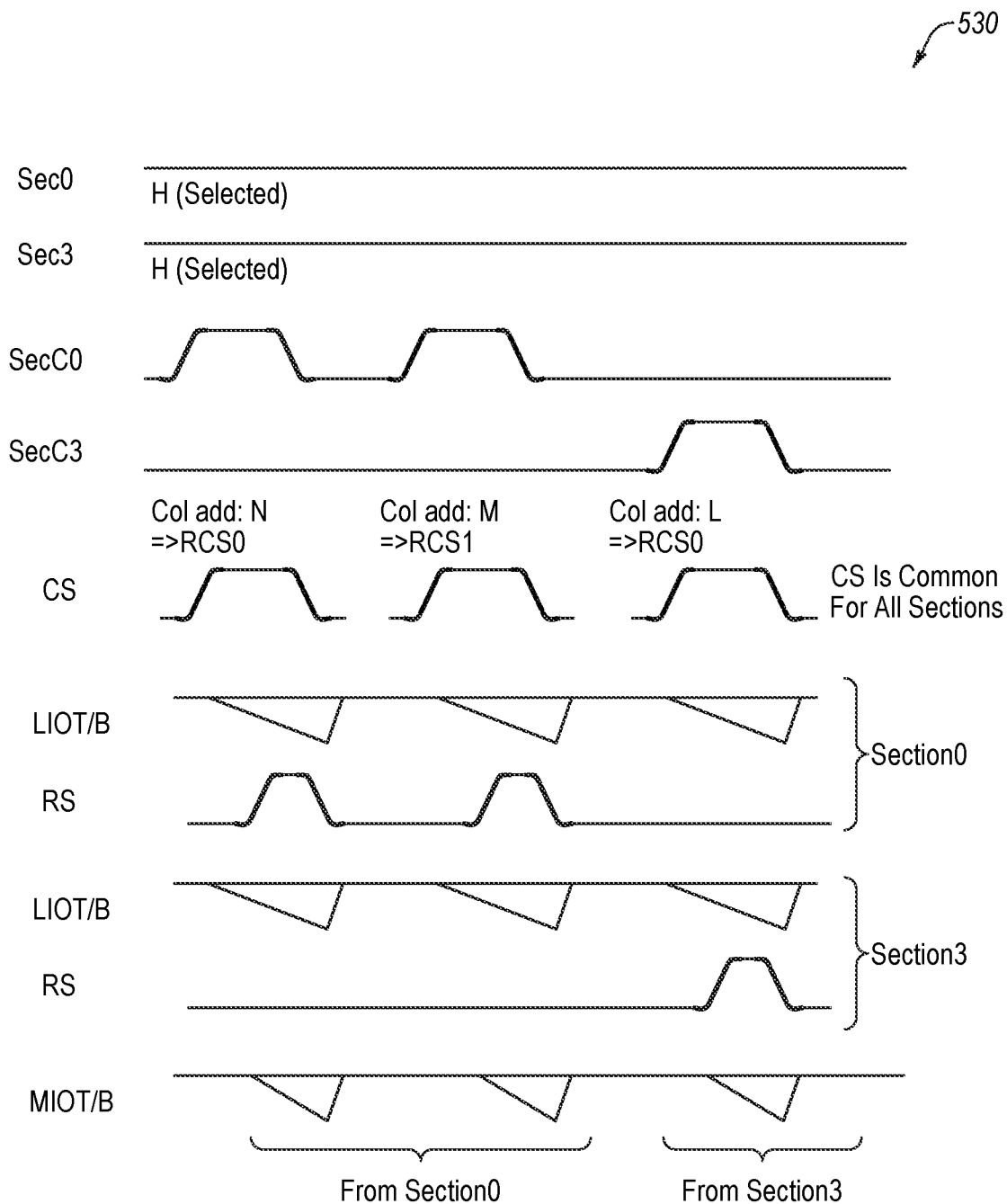
FIG. 5B is a timing diagram including various signals associated with the memory device of FIG. 5A.

More specifically, with reference to FIGS. 5A and 5B, a contemplated read operation performed on memory array 502 will now be described. Initially, control signal Sec0 and control signal Sec3 are each asserted (i.e., control signal Sec0 and control signal Sec3 are high (H)) in response to a row address, as shown in plot 530 of FIG. 5B. In response to the asserted control signal Sec0, both compare circuits of compare block 506_0 of row section unit 503_0 are enabled, and one compare circuit of compare block 506_3 of row section unit 503_3 is enabled.

If the selected column address "Col Address" matches column address N, column select (CS) signal (i.e., redundant column select signal RCS0) is asserted, control signal SecC0 is asserted to activate row section Section0, and redundant column address A is accessed. Further, in response to column select CS, data from redundant column address A is provided to local data lines LIOT/LIOB (e.g., via a sense amplifier) of each of row section Section0 and row section Section3. Further, in response to a read select RS for row section Section0, the data from redundant column address A is provided from local data lines LIOT/LIOB of row section Section0 to main data lines MIOT/MIOB.

If the selected column address "Col Address" matches column address M, column select (CS) signal (i.e., redundant column select signal RCS1) is asserted, control signal SecC0 is asserted to activate row section Section0, and redundant column address B is accessed. Further, in response to column select CS, data from redundant column address B is provided to local data lines LIOT/LIOB (e.g., via a sense amplifier) of each of row section Section0 and row section Section3. Further, in response to a read select RS for row section Section0, the data from redundant column address B is provided from local data lines LIOT/LIOB of row section Section0 to main data lines MIOT/MIOB.

If the selected column address "Col Address" matches column address L, column select (CS) signal (i.e., redundant column select signal RCS0) is asserted, control signal SecC3 is asserted to activate row section Section3, and redundant column address C is accessed. Further, in response to column select CS, data from redundant column address C is provided to local data lines LIOT/LIOB (e.g., via a sense amplifier) of each of row section Section0 and row section Section3. Further, in response to a read select RS for row section Section3, the data from redundant column address C is provided from local data lines LIOT/LIOB of row section Section3 to main data lines MIOT/MIOB. It will be appreciated that a write operation may be carried out in a similar manner.

Figure 6:
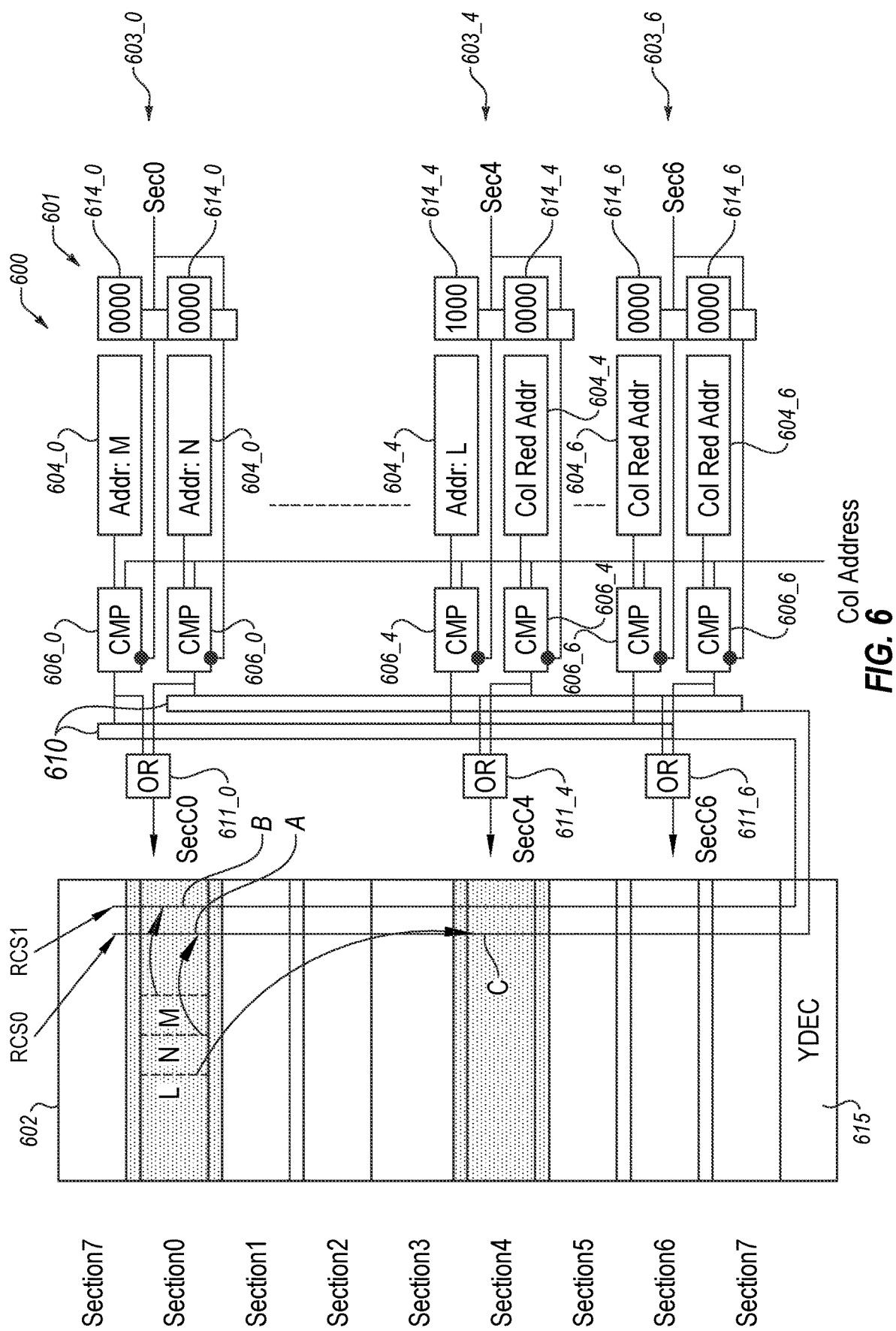
FIG. 6 depicts a portion of a memory array and associated control circuitry of another example memory device, according to various embodiments of the present disclosure.

FIG. 6 illustrates portion of another example memory device 600, according to various embodiments of the present disclosure. More specifically, FIG. 6 illustrates control circuitry 601 and a portion of a memory array 602 of memory device 600. For example only, control circuit 109 of FIG. 1 may include control circuitry 601. Memory array 602 includes a number of row sections (e.g., row sections Section0-Section7) and redundant column select signals RCS0 and RCS1. For example, each row section of memory array 602 may include a memory MAT. Each row section of memory array 602 includes a number (e.g., two) of redundant memory cells accessible via redundant columns addresses. Memory device 600 further includes column decoder ("YDEC") 615 configured to drive a column select (CS) signal.

Similar to control circuitry 501 of FIG. 5A, circuitry 601 includes a number of row section units 603, wherein each row section unit 603 includes a row section and a control circuit (e.g., including address data 604, compare block 606, logic 610, OR gates 611, and programmable element 614). More specifically, for example, row section unit 603_0 includes row section Section0 and a control circuit that includes address data 604_0, compare block 606_0, logic 610, OR gates 611_0, and programmable element 614_0. In this embodiment, programmable element 614 may include a multi-bit fuse (e.g., a four-bit fuse).

It will be appreciated that although memory array 602 includes more than three row sections, for simplicity FIG. 6 depicts circuitry for only three row sections (i.e., Section0, Section4, and Section6). Further, although memory array 602 is depicted as only including eight row sections (i.e., Section0-Section7), memory array 602 may include any suitable number of row sections.

As described above with reference to FIG. 5A, a number (e.g., two) row sections of a memory array may be paired (e.g., in a programmed (e.g., fixed) relationship). In some embodiments, as described more fully with reference to FIG. 6, a programmable element may include an enable bit and a row section address to establish a relationship (e.g. a pairing) between two or more row sections. More specifically, programmable element 614 may include a group of bits (e.g., "0000" or "1000"), wherein some bits of the group of bits may indicate a row section address, and at least one bit of the group of bits may be an enable bit. Yet more specifically, programmable element 614_4 includes "1000" wherein the most significant bit (MSB) (i.e., the "1") is an enable bit (e.g., indicating that the associated column address L is associated with another row section. Further, the other bits (e.g., the "000" bits) may indicate a row section address for a paired row section (i.e., row section Section0 in this example). As another example, if programmable element 614_4 included "1001", the "001" bits may indicate a row section address for row section Section1. As yet another example, if programmable element 614_4 included "1010", the "010" bits may indicate a row section address for row section Section2.

Further, according to various embodiments, one row section of memory array 602 may use redundant memory cells from more than one other row section of memory array 602. For example, if row section Section0 includes four defective memory cells, a programmable element 614 associated with each of, for example, row section Section2 and row section Section4 may include "1000", and thus, in this example, a redundant memory cell in row section Section2 may be used to replace a defective memory cell in row section Section0, and a redundant memory cell in row section Section4 may be used to replace of a defective memory cell row section Section0.

During a contemplated operation of memory device 600, row section unit 603_0 receives control signal Sec0, which is asserted responsive to a row address. Each compare circuit of compare block 606_0, which is enabled via control signal Sec0, may receive a selected column address "Col Address" and compare the selected column address to address data 604_0 (i.e., column address N and column address M). In response to the selected column address matching either column address N or column address M (i.e., determined via compare block 606_0), compare block 606_0 may generate a signal, which may assert a column select signal (i.e., column select signal RCS0 or column select signal RCS1) via logic 610. Further, OR gate 611_0, which may receive the signal from compare block 606_0, may generate an asserted control signal SecC0 to activate row section Section0. Depending on the selected column address, column select signal RCS0 may be selected to replace a memory cell at column address N with a redundant memory cell at redundant column address A, or column select signal RCS1 may be selected to replace a memory cell column address M with a redundant memory cell at redundant column address B.

Moreover, in this example, control signal Sec4 is also asserted (i.e., based on the programmed group of bits "1000" of programmable element 614_4). Further, a compare circuit of compare block 606_4 of row section unit 603_4 is enabled (i.e., via control signal Sec4), and compare block 606_4 may compare the selected column address "Col Address" to address data (i.e., column address L). Responsive to the selected column address matching column address L, row section Section4 may be activated (i.e., via control signal SecC4), column select signal RCS0 is asserted (i.e., via logic 610), and a memory cell at column address L of row section Section0 is replaced by a redundant memory cell at redundant column address C of row section Section4.

Figure 7A:
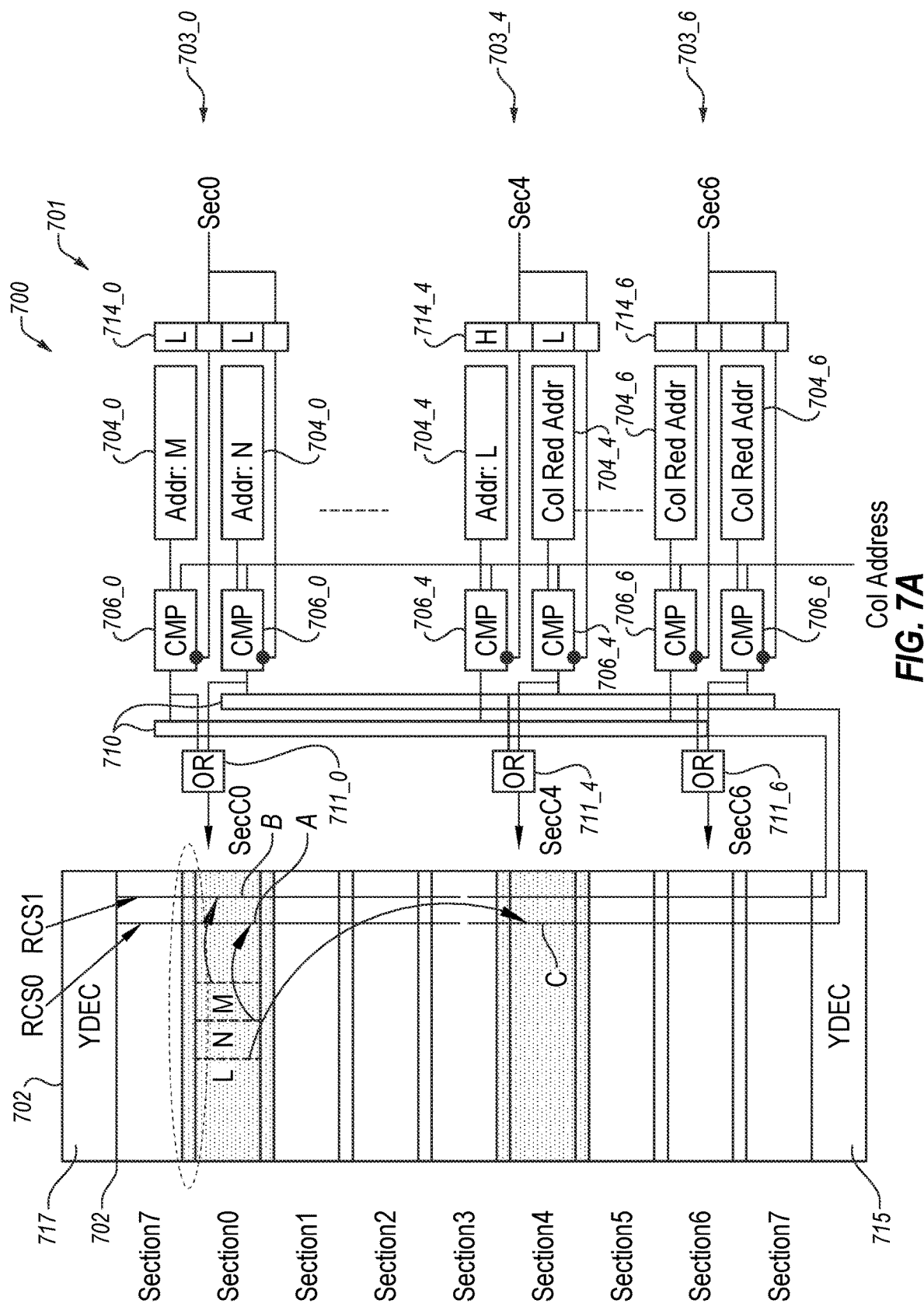
FIG. 7A depicts a portion of a memory array and associated control circuitry of yet another example memory device, according to various embodiments of the present disclosure.

FIG. 7A illustrates portion of yet another example memory device 700, according to various embodiments of the present disclosure. More specifically, FIG. 7A illustrates control circuitry 701 and a portion of a memory array 702 of memory device 700. For example only, control circuit 109 of FIG. 1 may include control circuitry 701. Memory array 702 includes a number of row sections (e.g., row sections Section0-Section7) and redundant column select signals RCS0 and RCS1. For example, each row section of memory array 702 may include a memory MAT. Each row section of memory array 702 includes a number (e.g., two) of redundant memory cells accessible via redundant columns addresses.

Similar to control circuitry 501 of FIG. 5A, control circuitry 701 includes a number of row section units 703, wherein each row section unit 703 includes a row section and a control circuit (e.g., including address data 704, compare block 706, logic 710, OR gates 711, and programmable element 714). More specifically, for example, row section unit 703_0 includes row section Section0 and a control circuit that includes address data 704_0, compare block 706_0, logic 710, OR gates 711_0, and programmable element 714_0). In this embodiment, programmable element 714 may include a one-bit fuse.

It will be appreciated that although memory array 702 includes more than three row sections, for simplicity FIG. 7A depicts circuitry for only three row sections (i.e., Section0, Section4, and Section6). Further, although memory array 702 is depicted as only including eight row sections (i.e., Section0-Section7), memory array 702 may include any suitable number of row sections.

Similar to the embodiment shown in FIG. 5A, in the embodiment of FIG. 7A, memory array 702 is programmed (e.g., via a programmable fuse) such that one row section of memory array 702, which includes more than a threshold number (e.g., two) defective memory cells, is paired with another row section of memory array. For example, row section Section0, which in this example includes three defective memory cells, is paired with row section Section4. As shown in FIG. 7A, programmable element 714_4 of row section unit 703_4 includes a high "H" bit and address data 704_4 of row section unit 703_4 stores column address L, which is a column address of row section Section0.

Further, in this embodiment, memory array 702 is associated with two column decoders 715 and 717. According to some embodiments, a first number of row sections of memory array 702 may be associated with (e.g., receive column select signals from) column decoder 715, and a second number of row sections of memory array 702 may be associated with (e.g., receive column select signals from) column decoder 715. Further, according to some embodiments, a first row section of a pair of row sections may be associated with column decoder 717, and a second row section of the pair of row sections may be associated with column decoder 715 (i.e., each row section of a row section pair receives independent column select signals). For example, in a row section pairing of row section Section0 and row section Section4, row section Section0 may be associated with column decoder 717, and row section Section4 may be associated with column decoder 715. According to some embodiments, column select (CS) may be shorted between column decoder 715 and column decoder 717.

Figure 7B:
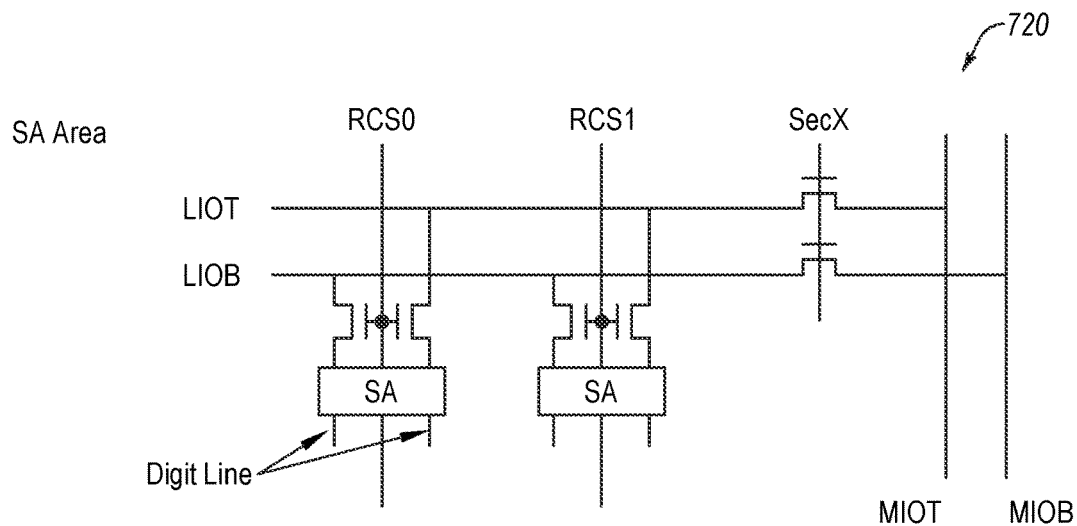
FIG. 7B illustrates circuitry including sense amplifiers of the memory device of FIG. 7A.
Figure 7C:
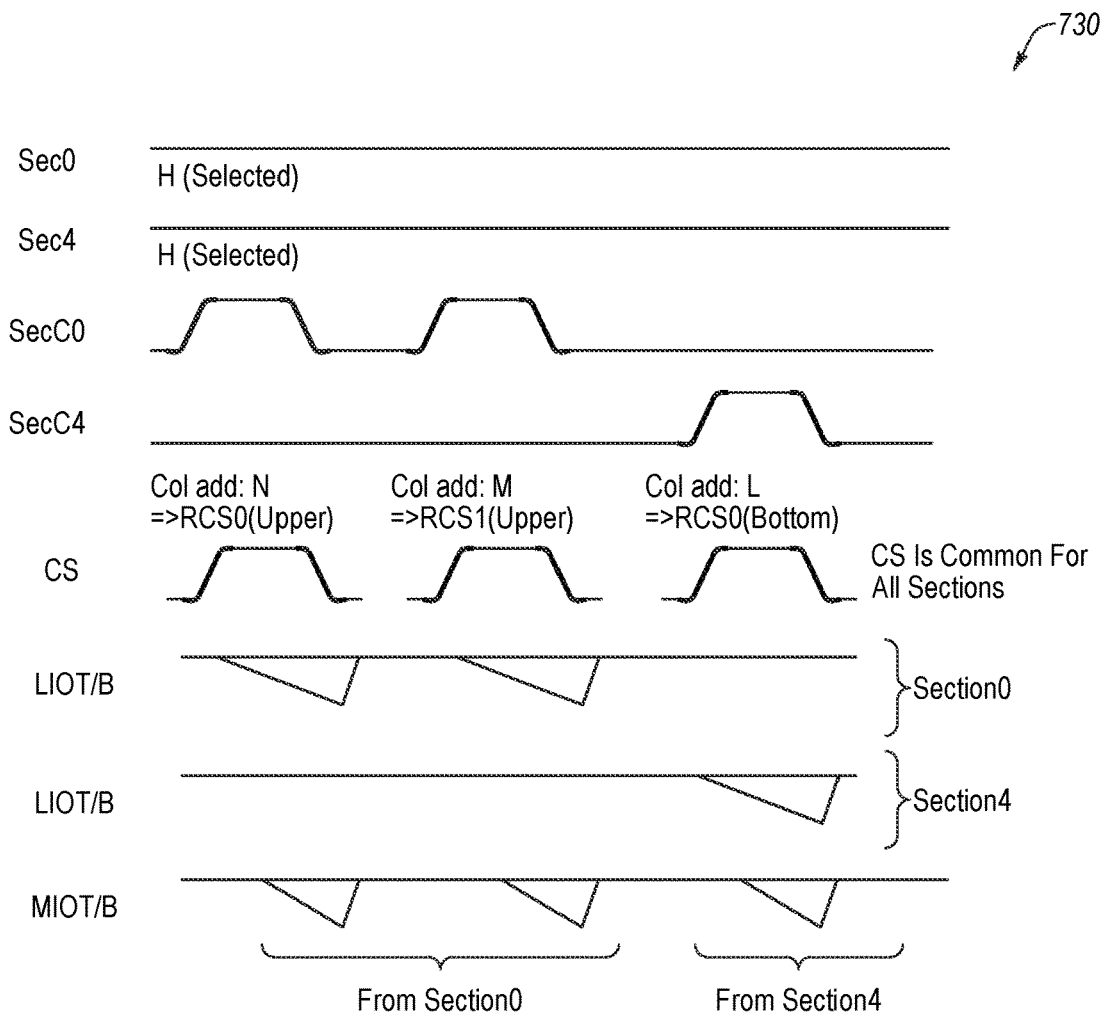
FIG. 7C is a timing diagram including various signals associated with the memory device of FIG. 7A.

Further, as shown in circuitry 720 of FIG. 7B, in the embodiment including two column decoders, local data lines LIOT/LIOB may be coupled to main data lines MIOT/MIOB via a transfer gate, and a read select switch may not be necessary. More specifically, with reference to FIGS. 7A, 7B, and 7C, a contemplated read operation performed on memory array 702 will now be described. Initially, control signal Sec0 and control signal Sec4 are each asserted (i.e., control signal Sec0 and control signal Sec3 are high (H)) in response to a row address, as shown in plot 730 of FIG. 7C. In response to the asserted control signal Sec0, both compare circuits of compare block 706_0 of row section unit 703_0 are enabled, and at least one compare circuit of compare block 706_4 of row section unit 703_4 is enabled.

If the selected column address "Col Address" matches column address N, column select (CS) signal (i.e., redundant column select signal RCS0) is asserted via column decoder 717, control signal SecC0 is asserted to activate row section Section0, and redundant column address A is accessed. Further, in response to column select CS, data from redundant column address A is provided to local data lines LIOT/LIOB (e.g., via a sense amplifier) of row section Section0, and the data is provided from local data lines LIOT/LIOB of row section Section0 to main data lines MIOT/MIOB.

If the selected column address "Col Address" matches column address M, column select (CS) signal (i.e., redundant column select signal RCS1) is asserted via column decoder 717, control signal SecC0 is asserted to activate row section Section0, and redundant column address B is accessed. Further, in response to column select CS, data from redundant column address B is provided to local data lines LIOT/LIOB (e.g., via a sense amplifier) of row section Section0, and the data is provided from local data lines LIOT/LIOB of row section Section0 to main data lines MIOT/MIOB.

If the selected column address "Col Address" matches column address L, column select (CS) signal (i.e., redundant column select signal RCS0) is asserted via column decoder 715, control signal SecC4 is asserted to activate row section Section4, and redundant column address C is accessed. Further, in response to column select CS, data from redundant column address C is provided to local data lines LIOT/LIOB (e.g., via a sense amplifier) of row section Section4, and the data is provided from local data lines LIOT/LIOB of row section Section4 to main data lines MIOT/MIOB. It will be appreciate that a write operation may be carried out in a similar manner.

Figure 8:
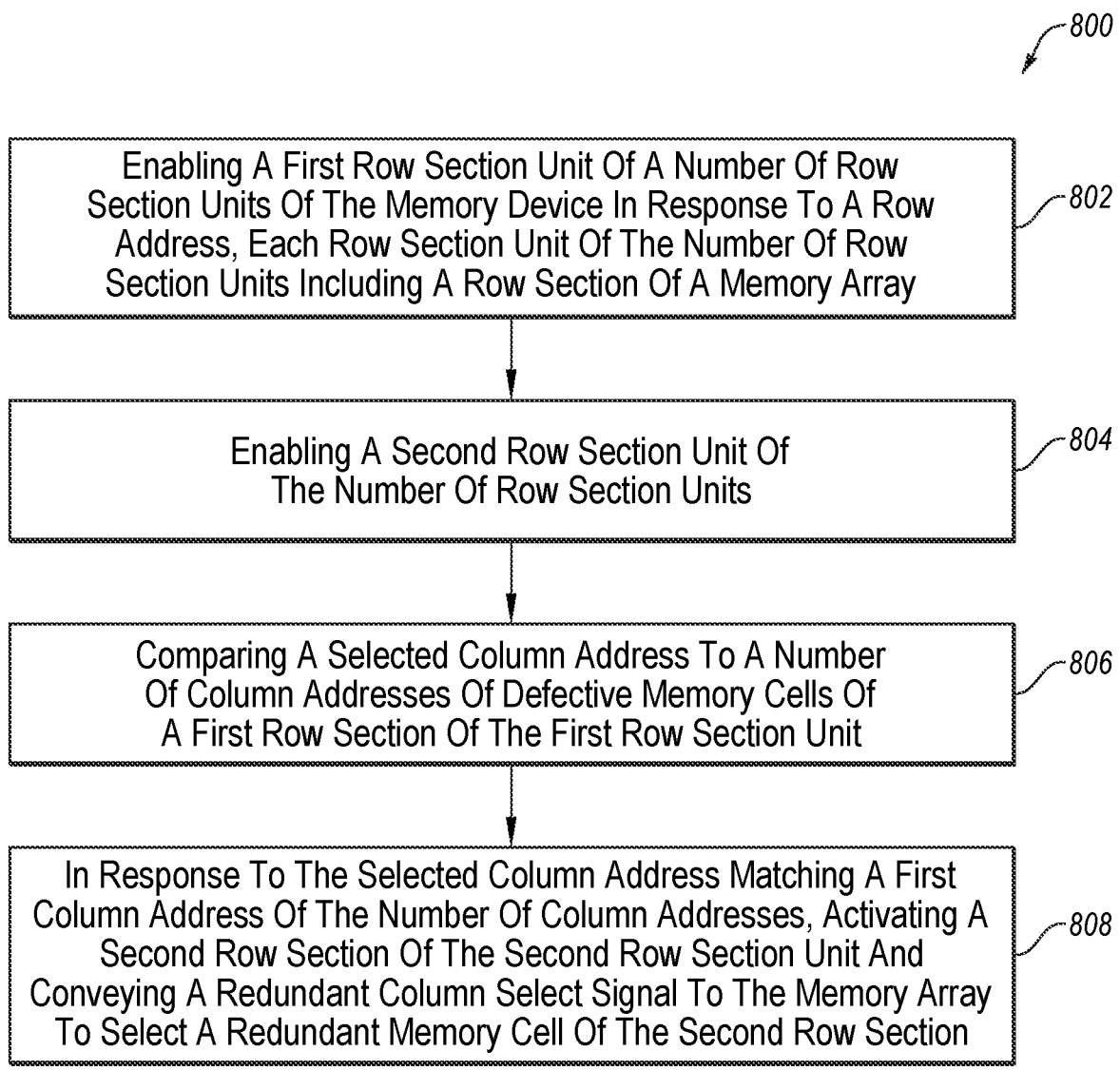
FIG. 8 is a flowchart of an example method of operating a memory device, in accordance with various embodiments of the present disclosure.

FIG. 8 is a flowchart of an example method 800 of operating a memory device, in accordance with various embodiments of the disclosure. Method 800 may be arranged in accordance with at least one embodiment described in the present disclosure. Method 800 may be performed, in some embodiments, by a device or system, such as memory device 100 of FIG. 1, memory array 402 of FIG. 4, memory device 500 of FIG. 5A, memory device 600 of FIG. 6, memory device 700 of FIG. 7A, a memory system 900 of FIG. 9, and/or an electronic system 1000 of FIG. 10, or another device or system. Although illustrated as discrete blocks, various blocks may be divided into additional blocks, combined into fewer blocks, or eliminated, depending on the desired implementation.

Method 800 may begin at block 802, wherein a first row section unit of a number of row section units of a memory array may be enabled in response to a selected row address, and method 800 may proceed to block 804. For example, at least some circuitry of the row section unit (e.g., row section unit 503_0 (see FIG. 5A), row section unit 603_0 (see FIG. 6), or row section unit 703_0 (see FIG. 7A)) may be enabled.

At block 804, a second row section unit of the number of row section units may be enabled, and method 800 may proceed to block 806. For example, at least some circuitry of the second row section unit (e.g., row section unit 503_3 (see FIG. 5A), row section unit 603_4 (see FIG. 6), or row section unit 703_4 (see FIG. 7A)) may be enabled (e.g., in response to being paired with the first row section unit and possibly one or programmed bits of the second row section unit).

At block 806, a selected column address may be compared to a number of column addresses of defective memory cells of a first row section of the first row section unit. For example, column address L (see e.g., FIGS. 5A, 6, and/or 7A) may be compared to the selected column address "Col Address" via a compare block (e.g., compare block 506_3 of FIG. 5A, compare block 606_4 of FIG. 6, or compare block 706_4 of FIG. 7A).

In response to the selected column address matching a first column address of the number of column addresses of the defective memory cells of the first row section, method 800 may proceed to block 808, wherein a second row section of the second row section unit may be activated and a redundant column select signal may be conveyed to the memory array to select a redundant memory cell of the second row section. For example, the second row section (e.g., row section Section3 (see FIG. 5A) or row section Section4 (see FIGS. 6 and/or 7A)) may be activated, and redundant column select signal RCS0 may be conveyed to the memory array (e.g., memory array 502 of FIG. 5A, memory array 602 of FIG. 6, or memory array 702 of FIG. 7A) to access (e.g., for a read or write operation) redundant memory cell C.

Modifications, additions, or omissions may be made to method 800 without departing from the scope of the present disclosure. For example, the operations of method 800 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein, in response to the selected column address matching either a second column address or a third column address of the number of column addresses, the first row section may be activated and an additional redundant column select signal may be conveyed to the memory array to select a redundant memory cell of the first row section. Further, the method may include one or more acts wherein the memory device may be programmed such that that second row section unit is paired with the first row section unit, and the second row section unit is enabled responsive to the first row section unit being enabled.

A memory system is also disclosed. According to various embodiments, the memory system may include a controller and a number of memory devices. Each memory device may include one or more memory cell arrays, which may include a number of memory cells.

Figure 9:
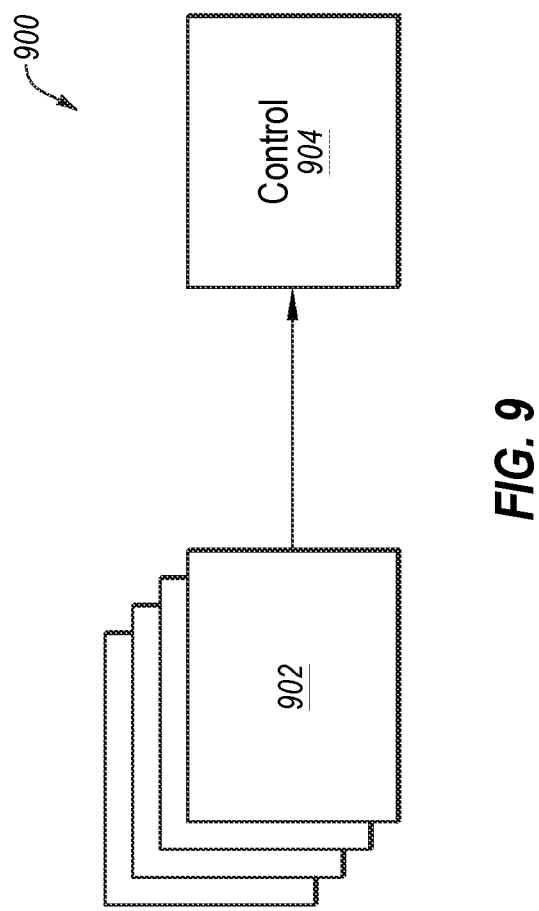
FIG. 9 is a simplified block diagram of a memory system, in accordance with various embodiments of the present disclosure.

FIG. 9 is a simplified block diagram of a memory system 900 implemented according to one or more embodiments described herein. Memory system 900, which may include, for example, a semiconductor device, includes a number of memory devices 902 and a controller 904. For example, at least one memory device 902 may include a number of a number of row section units, as described herein. Controller 904 may be operatively coupled with memory devices 902 so as to convey command/address signals (e.g., command/address signals COM/ADD of FIG. 1) to memory devices 902.

An electronic system is also disclosed. According to various embodiments, the electronic system may include one or more memory devices, each memory device having an array of memory cells. Each memory cell may include an access transistor and a storage element operably coupled with the access transistor.

Figure 10:
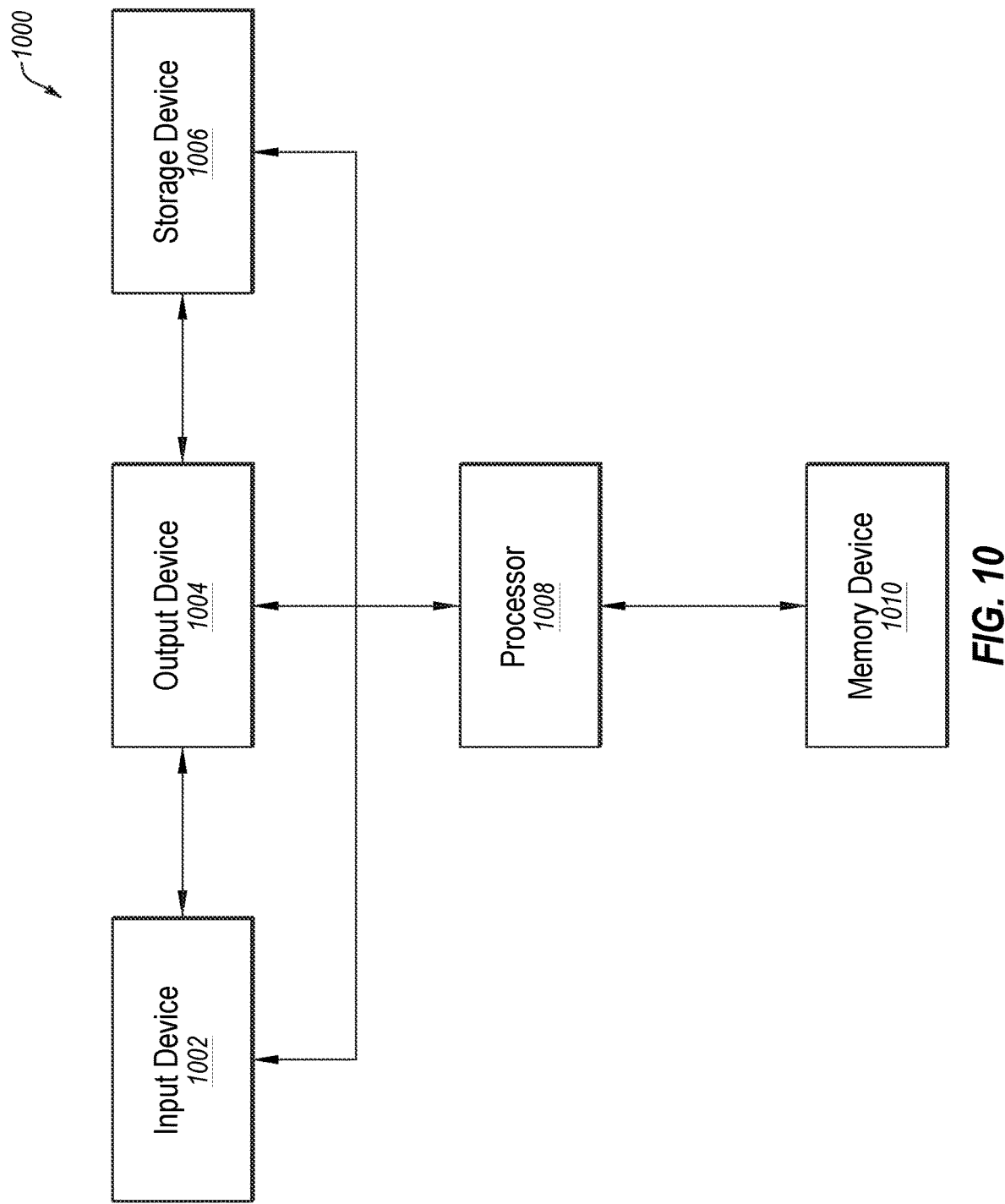
FIG. 10 is a simplified block diagram of an electronic system, in accordance with various embodiments of the present disclosure.

FIG. 10 is a simplified block diagram of an electronic system 1000 implemented according to one or more embodiments described herein. Electronic system 1000 includes at least one input device 1002, which may include, for example, a keyboard, a mouse, or a touch screen. Electronic system 1000 further includes at least one output device 1004, such as a monitor, a touch screen, or a speaker. Input device 1002 and output device 1004 are not necessarily separable from one another. Electronic system 1000 further includes a storage device 1006. Input device 1002, output device 1004, and storage device 1006 may be coupled to a processor 1008. Electronic system 1000 further includes a memory device 1010 coupled to processor 1008. Memory device 1010 may include memory system 900 of FIG. 9. Electronic system 1000 may include, for example, a computing, processing, industrial, or consumer product. For example, without limitation, electronic system 1000 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the present disclosure may include a method of operating a memory device. The method may include enabling a first row section unit of a number of row section units of the memory device in response to a row address. Each row section unit of the number of row section units may include a row section of a memory array. The method may also include enabling a second row section unit of the number of row section units. Further, the method may include comparing a selected column address to a number of column addresses of defective memory cells of a first row section of the first row section unit. In response to the selected column address matching a first column address of the number of column addresses, the method may include activating a second row section of the second row section unit and conveying a redundant column select signal to the memory array to select a redundant memory cell of the second row section.

One or more other embodiments of the present disclosure include an apparatus. The apparatus may include a memory array including a number of row sections, wherein the number of row sections include a first row section and a second row section. The apparatus may also include control circuitry coupled to the memory array. The control circuitry may be configured to compare a received selected column address for the first row section to one or more of a number of stored column addresses for defective memory cells of the first row section. The control circuitry may also be configured to activate the second row section and convey a redundant column select signal to the memory array to access a redundant memory cell of the second row section in response to the selected column address matching a first stored column address of the number of stored column addresses.

Additional embodiments of the present disclosure include a system. The system may include at least one input device, at least one output device, and at least one processor device operably coupled to the input device and the output device. The system may also include at least one memory device operably coupled to the at least one processor device and comprising a memory array including a number of row sections. Each row section may include a number of memory cells, wherein the number of row sections including a row section pair including a first row section and a second row section. The memory device may also include a number of control circuits including a first control circuit coupled to the first row section and a second control circuit coupled to the second row section. The second control circuit may be configured to store a first number of column addresses for defective memory cells of the first row section. The second control circuit may also be configured to compare a received selected column address for the first row section to one or more of the first number of stored column addresses for the defective memory cells of the first row section. Further, the second control circuit may be configured to activate the second row section and convey a redundant column select signal to the memory array to select a redundant memory cell of the second row section in response to the selected column address matching a column address of the first number of stored column addresses.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method of operating a memory device, comprising:
    comparing a selected column address for a first row section of a memory array to one or more of a number of column addresses for a number of defective memory cells of the first row section;
    in response to determining that the number of defective memory cells of the first row section is more than a threshold number of defective memory cells for a row section, pairing a second row section of the memory array with the first row section such that the second row section is activated in response to the first row section being activated;
    programming a first bit associated with the second row section is a first logic state indicating that a first redundant memory cell of the second row section is to be used for the first row section;
    programming a second bit associated with the second row section in a second, different logic state indicating that a second redundant memory cell of the second row section is to be used for the second row section; and
    accessing the first redundant memory cell of the second row section of the memory array in response to the selected column address for the first row section matching a stored column address of the number of column addresses for defective memory cells of the first row section.

2. The method of claim 1, wherein accessing the first redundant memory cell of the second row section comprises activating the second row section and conveying a redundant column select signal to the memory array.

3. The method of claim 2, comprising, in response to the selected column address matching either a second column address or a third column address of the number of column addresses, conveying an additional redundant column select signal to the memory array to select a redundant memory cell of the first row section, wherein conveying the redundant column select signal comprises conveying the redundant column select signal via a first column decoder, and wherein conveying the additional redundant column select signal comprises conveying the additional redundant column select signal via a second, different column decoder.

4. The method of claim 1, comprising enabling each of a first row section unit including the first row section and a second row section unit including the second row section based at least partially on a pre-programmed pairing of the first row section unit and the second row section unit.

5. The method of claim 4, wherein enabling the first row section unit comprises enabling control circuitry of the first row section unit, and wherein enabling the second row section unit comprises enabling control circuitry of the second row section unit.

6. The method of claim 4, comprising programming the memory device such that that second row section unit is paired with the first row section unit and the second row section unit is enabled responsive to the first row section unit being enabled.

7. An apparatus, comprising:
a memory array including a number of row sections; and
circuitry coupled to the memory array and configured to:
program a first bit associated with a first row section in a logic state indicating that a first redundant memory cell of the first row section is to be used for a second row section;
access the first redundant memory cell of the first row section in response to a selected column address for the second row section matching a stored column address of a number of column addresses for defective memory cells of the second row section;
activate the first row section; and
activate the second row section based at least partially on a pre-programmed pairing of the first row section and the second row section and the first bit being in the logic state.

8. The apparatus of claim 7, wherein the circuitry is configured to convey a redundant column select signal to the memory array to access the first redundant memory cell of the first row section.

9. The apparatus of claim 8, wherein the circuitry is configured to convey another redundant column select signal to the memory array to access a redundant memory cell of the second row section in response to the selected column address matching either a second stored column address or a third stored column address of the number of column addresses.

10. The apparatus of claim 8, wherein the circuitry includes a number of control circuits, each row section of the memory array associated with a dedicated control circuit of the number of control circuits.

11. The apparatus of claim 10, wherein each control circuit of the number of control circuits is configured to store one or more of the number of column addresses for defective memory cells of the memory array, wherein the stored column address of the number of column addresses for the defective memory cells of the second row section is stored in a control circuit associated with the first row section.

12. The apparatus of claim 7, wherein the circuitry includes one or more programmable bits, wherein the circuitry is configured to enable a control circuit of the circuitry coupled to the first row section based on at least one bit of the one or more programmable bits.

13. The apparatus of claim 12, wherein the control circuit includes a programmable element programmed with at least one bit of the one or more programmable bits.

14. The apparatus of claim 7, wherein the first row section is configured to receive a column select signal from a first column decoder and the second row section is configured to receive another column select signal from a second column decoder.

15. The apparatus of claim 7, comprising:
a first column decoder configured to convey a redundant column select signal to the first row section; and
a second column decoder configured to convey another redundant column select signal to the second row section.

16. A system comprising:
at least one input device;
at least one output device;
at least one processor device operably coupled to the input device and the output device; and
a memory device operably coupled to the at least one processor device and comprising:
a memory array including a number of row sections, each row section including a number of memory cells, the number of row sections including a row section pair including a first row section and a second row section such that the second row section is activated in response to the first row section being activated; and
control circuitry configured to activate the second row section and convey a redundant column select signal to the memory array to select a redundant memory cell of the second row section in response to a selected column address matching a column address of a first number of column addresses for a defective memory cells of the first row section and a programming bit of a number of programmable bits associated with the second row section being in a logic state indicating that the redundant memory cell of the second row section is to be used for the first row section.

17. The system of claim 16, wherein the control circuitry is configured to:
store a first number of column addresses for defective memory cells of the first row section;
compare the selected column address for the first row section to one or more of the first number of column addresses for the defective memory cells of the first row section;
store a second number of column addresses for the defective memory cells of the first row section;
compare the selected column address for the first row section to one or more of the second number of column addresses for the defective memory cells of the first row section; and
activate the first row section and convey another redundant column select signal to the memory array to select a redundant memory cell of the first row section in response to the selected column address matching a column address of the second number of column addresses.

18. The system of claim 16, wherein the control circuitry includes a first control circuit and a second control circuit, wherein the second control circuit includes one or more programmable bits, wherein the memory device is configured to enable the second control circuit based on at least one bit of the one or more programmable bits.

19. The system of claim 18, wherein the one or more programmable bits includes at least one enable bit and at least one bit representing an address of the first row section.

20. The system of claim 16, wherein the memory device is configured to read from or write to the redundant memory cell of the second row section in response to the selected column address matching a column address of the first number of column addresses.

* * * * *